United States Patent [19]
Goto

[11] Patent Number: 4,547,743
[45] Date of Patent: Oct. 15, 1985

[54] VARIABLE RESISTANCE GAIN CONTROL INTEGRATED CIRCUIT

[75] Inventor: Kuniaki Goto, Yokohama, Japan

[73] Assignee: Tokyo Shibaura Denki Kabushiki Kaisha, Kawasaki, Japan

[21] Appl. No.: 531,616

[22] Filed: Sep. 13, 1983

[30] Foreign Application Priority Data

Sep. 20, 1982 [JP] Japan ................................ 57-163406

[51] Int. Cl.$^4$ ............................................... H03G 3/30
[52] U.S. Cl. .................................... 330/254; 330/283; 330/307; 357/46; 357/51
[58] Field of Search ........................ 330/254, 283, 307; 357/46, 51

[56] References Cited

U.S. PATENT DOCUMENTS 4,131,809  12/1978  Baars ..................................... 307/303
4,250,411  2/1981   Kriedt ............................. 330/254 X Primary Examiner—James B. Mullins
Attorney, Agent, or Firm—Finnegan, Henderson, Farabow, Garrett & Dunner

[57] ABSTRACT

A variable resistance gain control integrated circuit has a resistor inserted between the emitters of two transistors serving as a differential pair, and two transistors which serve as an active load and have their emitters connected to the emitters of the two transistors serving as a differential pair. The resistor and the transistors serving as the active load are formed within a single semiconductor island region.

15 Claims, 5 Drawing Figures

F I G. 1
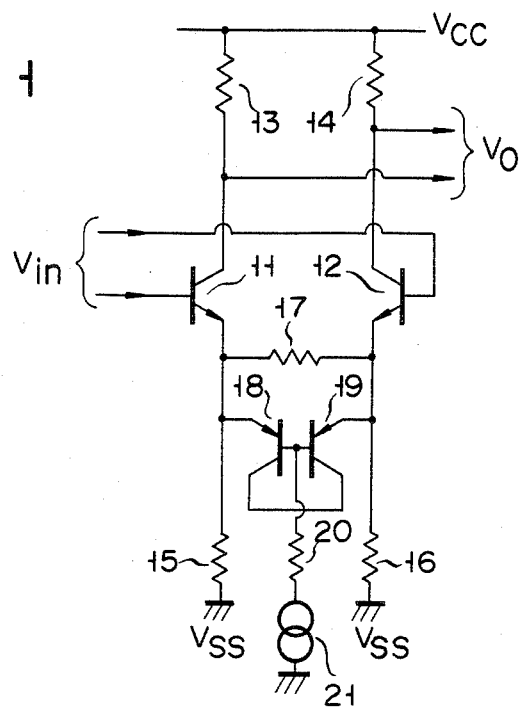
F I G. 2A
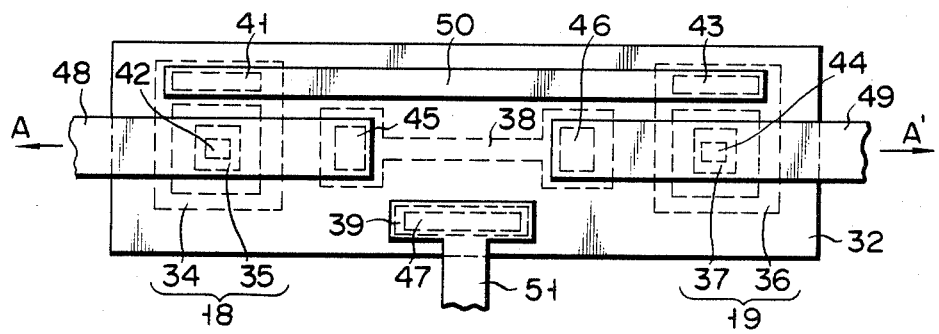
F I G. 2B
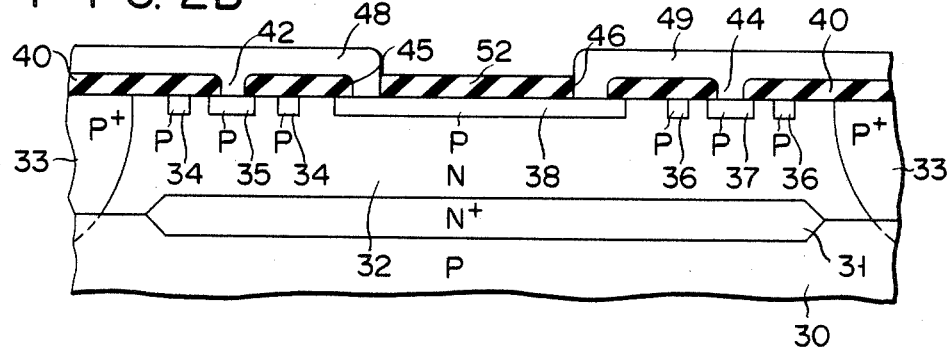

VARIABLE RESISTANCE GAIN CONTROL INTEGRATED CIRCUIT

BACKGROUND OF THE INVENTION

The present invention relates to a gain control integrated circuit and, more particularly, to a variable resistance gain control integrated circuit used for the automatic gain control power stage of a television video signal amplifying system.

In a variable resistance gain control integrated circuit of this type, resistors are connected to the emitters of two transistors constituting a differential pair, and a further two transistors are inserted as an active load. By changing a gain control current source connected to the two transistors serving as the active load, saturation resistances thereof can be varied. As a result, emitter resistances of the two transistors serving as the differential pair change, to effect gain control of the circuit.

The integrated circuit of this type generally consists of two transistors serving as a differential pair, another two transistors serving as an active load, and several resistors. Conventionally, the four transistors are formed in different semiconductor island regions, respectively, and the remaining resistors are combined in a single semiconductor island region. However, such a plurality of isolated semiconductor island regions does not allow for appreciable reduction in pattern area.

SUMMARY OF THE INVENTION

Therefore, a primary object of the present invention is to provide a variable resistance gain control integrated circuit requiring a small number of semiconductor island regions, thereby reducing the pattern area.

To achieve the above object of the present invention, a variable resistance gain control integrated circuit is provided, which comprises first and second transistors constituting a differential pair; first and second resistors inserted between collectors of said first and second transistors and a first power supply, respectively; third and fourth resistors inserted between emitters of said first and second transistors and a second power supply, respectively; a fifth resistor inserted between the emitters of said first and second transistors; third and fourth transistors, the emitters of which are respectively connected to the emitters of said first and second transistors, the bases of which are connected to each other, and the collectors of which are connected to each other, said third and fourth transistors being combined with said fifth resistor in a semiconductor island region; and a sixth resistor inserted between a common node of the bases of said third and fourth transistors and a gain control current source.

BRIEF DESCRIPTION OF THE DRAWINGS

FIG. 1 is a circuit diagram showing an equivalent circuit of a variable resistance gain control integrated circuit according to the present invention;

FIG. 2A is a plan view showing part of a variable resistance gain control integrated circuit according to an embodiment of the present invention;

FIG. 2B is a sectional view of the partial integrated circuit shown in FIG. 2A, taken along line A-A' thereof;

DETAILED DESCRIPTION OF THE PREFERRED EMBODIMENTS

Figure 3:
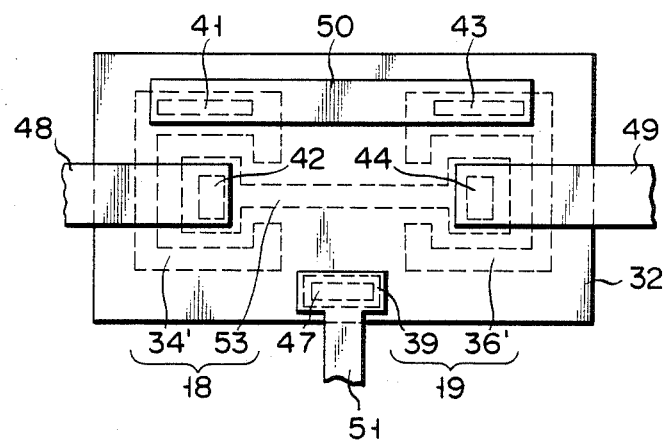
FIG. 3 is a plan view showing part of a variable resistance gain control integrated circuit according to another embodiment of the present invention.

FIG. 1 shows an equivalent circuit of a variable resistance gain control integrated circuit according to the present invention. Referring to FIG. 1, npn transistors 11 and 12 constitute a differential pair. A differential input voltage Vin is applied to the bases of npn transistors 11 and 12. The collectors of transistors 11 and 12 are connected to a first power supply Vcc through resistors 13 and 14, respectively. The emitters of transistors 11 and 12 are connected to a second power supply (i.e., to a ground power supply Vss) through resistors 15 and 16, respectively. A resistor 17 is connected between the emitters of transistors 11 and 12. The emitters of transistors 11 and 12 are respectively connected to the emitters of two pnp transistors 18, 19 serving as a variable load. The bases of transistors 18 and 19 are connected to each other, as are the collectors thereof. The common node of the bases is connected to one end of a gain control current source 21, through a resistor 20. The current value of the gain control current source 21 can be variable, with the other end thereof being connected to the ground power supply Vss. Differential output voltages $V_O$ are produced from the collectors of transistors 11 and 12.

The gain is controlled in the following manner. When the value of the gain control current source 21 is set at zero, the total gain of the circuit is a given value determined by the ratio of a set of resistors 15, 16 and 17 to load resistors 13 and 14. On the other hand, the value of the gain control current source 21 is large enough to operate transistors 18 and 19 in the saturation regions. The saturation resistances of transistors 18 and 19 are considerably lower than those of the resistors 15, 16, 17, so that the values of the emitter resistances of transistors 18 and 19 prove to have been lowered. In this case, the circuit gain is increased, as compared to that of the previous state. Therefore, by changing the value of the gain control current source 21, the saturation resistances cause a change in the circuit gain.

FIG. 2A is a plan view of a variable resistance gain control integrated circuit (illustrated as the equivalent circuit shown in FIG. 1) according to an embodiment of the present invention, and FIG. 2B is a sectional view thereof, taken along line A-A'. FIGS. 2A and 2B show only part of the integrated circuit. According to this embodiment, transistors 18 and 19 and resistor 17 are formed in a single semiconductor island region, in order to form the circuit (FIG. 1) as an integrated circuit.

An $n^+$-type buried layer 31 is formed on a p-type silicon substrate 30. An n-type semiconductor region 32 is formed by epitaxial growth or the like on the $n^+$-type buried layer 31. The n-type semiconductor region 32, which corresponds to the $n^+$-type buried layer 31, is surrounded by a $p^+$-type isolation region (guard ring) 33 formed by a diffusion technique, and is isolated from other n-type semiconductor regions (not shown), to constitute an island region. A closed rectangular semiconductor region 34 is formed by a diffusion technique in the semiconductor region 32, as the island region, isolated from all other semiconductor regions. A p-type semiconductor region 35 within the annular semiconductor region 34 to be spaced apart therefrom is formed by a diffusion technique in a surface layer region of the semiconductor region 32. A closed rectangular p-type semiconductor region 36 and a p-type semiconductor region 37 within the region 36 to be spaced apart therefrom are formed, by the diffusion technique, in another region of the surface layer of the semiconductor region 32, and are spaced apart from semiconductor regions 34 and 35. A p-type semiconductor region 38 is formed by a diffusion technique in still another region of the surface layer of the n-type semiconductor region 32, between the two p-type semiconductor regions 34, 36. Furthermore, an n+-type semiconductor region 39 is formed by a diffusion technique, substantially midway between the two annular p-type semiconductor regions 34, 36. A silicon dioxide film 40 is so formed as to cover the entire surface of the resultant structure, after the diffusion processes. The silicon oxide film 40 is selectively etched, to expose partial surfaces of the p-type semiconductor regions 34, 35, 36, 37, 38, thereby forming contact holes 41 and 42 in p-type semiconductor regions 34 and 35 and contact holes 43 and 44 in p-type semiconductor regions 36 and 37, respectively. Contact holes 45 and 46 are formed at the two ends of p-type semiconductor region 38, respectively. Similarly, the silicon dioxide film 40 is selectively etched to partially expose the surface of n+-type semiconductor region 39, thereby forming a contact hole 47 in n+-type semiconductor region 39. A conductive material such as aluminum is deposited in such a way as to cover the entire surface, to a predetermined thickness, after formation of the contact holes. Thereafter, the aluminum film is patterned by selective etching, in such a way that p-type semiconductor region 35 is connected to one end of p-type semiconductor region 38, through contact holes 42 and 45 by a conductive layer 48. The conductive layer 48 is also connected to the emitter region of transistor 11 which is in another island region (not shown). Similarly, p-type semiconductor region 37 is connected to the other end of p-type semiconductor region 38, through contact holes 44 and 46 by a conductive layer 49. The conductive layer 49 is also connected to the emitter region of transistor 12, which is in another island region (not shown). A conductive layer 50 is formed to connect p-type semiconductor region 34 and p-type semiconductor region 36, through the contact holes 41 and 43. A conductive layer 51 is formed to connect n+-type semiconductor region 39 to one end of the resistor 20 formed in another island region (not shown), through the contact hole 47. Thereafter, a silicon oxide film 52 is deposited on an exposed portion of p-type semiconductor region 38.

Pnp transistor 18, pnp transistor 19 and resistor 17 are formed in n-type semiconductor region 32, being isolated by p+-type isolation region 33. Pnp transistor 18 has p-type semiconductor region 34 as its collector region, p-type semiconductor region 35 as its emitter region, and n-type semiconductor region 32 as its base region. Pnp transistor 19 has p-type semiconductor region 36 as its collector region, p-type semiconductor region 37 as its emitter region, and n-type semiconductor region 32 as its base region. Resistor 17 is formed by p-type semiconductor region 38, being formed between transistors 18 and 19. The collectors of transistors 18 and 19 are connected to each other through conductive layer 50. The emitter of transistor 18 is connected to resistor 17 through conductive layer 48. The emitter of transistor 19 is connected to resistor 17 through conductive layer 49. Transistors 18 and 19 have a common base region, the bases thereof being connected to each other.

According to the variable resistance gain control integrated circuit, since the transistors 18, 19 and the resistor 17 are formed in a single semiconductor region, the number of required semiconductor regions is decreased. For this reason, the pattern area is reduced, as compared to the conventional pattern area, resulting in a lower cost.

FIG. 3 is a plan view of a variable resistance gain control integrated circuit according to another embodiment of the present invention. Transistors 18 and 19 and resistor 17 are formed in a single semiconductor region, in the same manner as in the embodiment shown in FIG. 2. The p-type semiconductor region 38 serving as the resistor 17 is not formed independently. The two p-type semiconductor regions 35, 37 serving as the emitter regions of transistors 18 and 19 are integrally formed, so as to constitute a p-type semiconductor region 53 extending therebetween. Part of the p-type semiconductor region 53 is used as the resistor 17. For this reason, the contact hole 42 used for the emitter of transistor 18 also serves as the contact hole (45 in FIG. 2) of the resistor 17. Similarly, the contact hole 44 of the emitter of transistor 19 also serves as the contact hole (46 in FIG. 2) of the resistor 17. Patterns of p-type semiconductor regions 34' and 36', respectively corresponding to transistors 18 and 19 are modified from the structure of the pattern shown in FIG. 2, so as not to overlap the pattern of the p-type semiconductor region 53. Since any other parts are substantially the same as those shown in FIG. 2, a detailed description thereof will be omitted.

Figure 4:
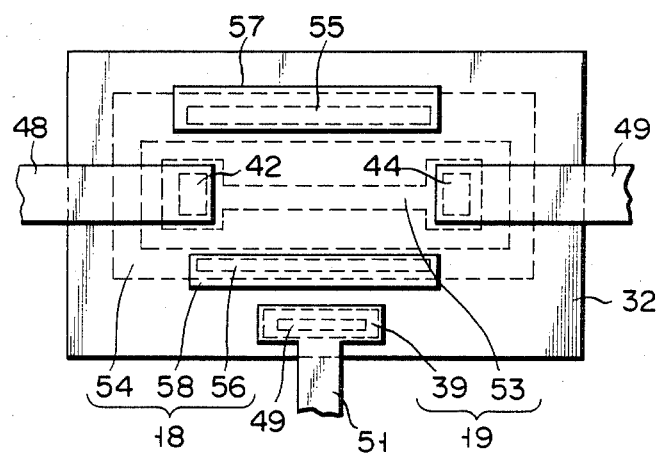
FIG. 4 is a plan view showing part of a variable resistance gain control integrated circuit according to still another embodiment of the present invention.

FIG. 4 is a plan view of a variable resistance gain control integrated circuit according to still another embodiment of the present invention. Transistors 18 and 19 and resistor 17 are formed in a single semiconductor region, in the same manner as in the embodiment shown in FIG. 2. Furthermore, resistor 17 is constituted by part of a p-type semiconductor region 53 serving as the common emitter region of transistors 18 and 19, in the same manner as in the embodiment shown in FIG. 3. The p-type semiconductor regions 34, 36 (FIG. 2) serving as the collector regions of transistors 18 and 19 are integrally formed, to constitute a single p-type semiconductor region 54. Contact holes 55 and 56 are so formed as to partially expose the surface of this p-type semiconductor region 54. Conductive layers 57 and 58, being made of aluminum, are so formed as to cover contact holes 55 and 56, thereby sufficiently decreasing the saturation resistances of transistors 18 and 19.

The present invention is not limited to the particular embodiments described above, since various changes and modifications may be made within its spirit and scope. In the above embodiments, pnp transistors 18 and 19 are used. However, the equivalent circuit shown in FIG. 1 may be arranged by using npn transistors as transistors 18 and 19. In this case, the conductivity types of the other regions are reversed. In the above embodiments, conductive layers 48 and 49 are made of aluminum. However, a material such as a polycrystalline silicon or a combination of a polycrystalline silicon and a metal may be used.

What is claimed is:

1. A variable resistance gain control integrated circuit comprising:
   first and second transistors constituting a differential pair;
   first and second resistors inserted between collectors of said first and second transistors and a first power supply, respectively;

third and fourth resistors inserted between emitters of said first and second transistors and a second power supply, respectively;

a fifth resistor inserted between the emitters of said first and second transistors;

third and fourth transistors, the emitters of which are respectively connected to the emitters of said first and second transistors, the bases of which are connected to each other, and the collectors of which are connected to each other, said third and fourth transistors being combined with said fifth resistor in a semiconductor island region, said third transistor having as a base region in a surface layer of a semiconductor substrate of one conductivity type, a first semiconductor region of the other conductivity type which serves as said semiconductor island region and which is so formed as to be isolated from another semiconductor region, and emitter and collector regions formed as second and third semiconductor regions of the one conductivity type, being formed adjacent to each other within said first semiconductor region, said fourth transistor having said first semiconductor region as a base region, and fourth and fifth semiconductor regions of the one conductivity type as emitter and collector regions which are spaced apart from said second and third semiconductor regions, are adjacent to each other and are formed in said first semiconductor region, and said fifth resistor comprising a sixth semiconductor region of the one conductivity type, being formed between said third and fourth transistors within said first semiconductor region; and a sixth resistor inserted between a common node of the bases of said third and fourth transistors and a gain control current source.

2. A circuit according to claim 1, further comprising a conductive layer for connecting said sixth semiconductor region to said second semiconductor region, and a conductive layer for connecting said sixth semiconductor region to said fourth semiconductor region.

3. A circuit according to claim 1, wherein said second and fourth semiconductor regions are formed as sections of one continuous region of said one conductivity type, whereupon said third and fourth transistors have a common emitter region.

4. A circuit according to claim 3, wherein said fifth resistor comprises a part of said common emitter region lying between said sections defining said second and fourth semiconductor regions.

5. A circuit according to claim 4, wherein said third and fifth semiconductor regions are formed as sections of one continuous region of said one conductivity type to form a common collector region.

6. A variable resistance gain control integrated circuit comprising:

first and second transistors constituting a differential pair;

first and second resistors inserted between collectors of said first and second transistors and a first power supply, respectively;

third and fourth resistors inserted between emitters of said first and second transistors and a second power supply, respectively;

a fifth resistor inserted between the emitters of said first and second transistors;

third and fourth transistors, the emitters of which are respectively connected to the emitters of said first and second transistors, the bases of which are connected to each other, and the collectors of which are connected to each other, said third and fourth transistors being combined with said fifth resistor in a semiconductor island region, said third transistor having, as a base region in a surface layer of a semiconductor substrate of one conductivity type, a first semiconductor region of the other conductivity type, which serves as said semiconductor island region and is so formed as to be isolated from another semiconductor island region, and second and third semiconductor regions of the one conductivity type, which serve as emitter and collector regions and are formed adjacent to one another and within said first semiconductor region, said fourth transistor having said first semiconductor region as a base region, said second semiconductor region as an emitter region, and a fourth semiconductor region as a collector region which is spaced apart from said third semiconductor region, and which is adjacent to said second semiconductor region and is formed in said first semiconductor region, said fifth resistor comprising part of said second semiconductor region; and a sixth resistor inserted between a common node of the bases of said third and fourth transistors and a gain control current source.

7. A variable resistance gain control integrated circuit comprising:

first and second transistors constituting a differential pair;

first and second resistors inserted between collectors of said first and second transistors and a first power supply, respectively;

third and fourth resistors inserted between emitters of said first and second transistors and a second power supply, respectively;

a fifth resistor inserted between the emitters of said first and second transistors;

third and fourth transistors, the emitters of which are respectively connected to the emitters of said first and second transistors, the bases of which are connected to each other, and the collectors of which are connected to each other, said third and fourth transistors being combined with said fifth resistor in a semiconductor island region, said third transistor having, as a base region in a surface layer of a semiconductor substrate of one conductivity type, a first semiconductor region of the other conductivity type, which serves as said semiconductor island region and is so formed as to be isolated from another semiconductor island region, and second and third semiconductor regions of the one conductivity type as emitter and collector regions which are so formed in said first semiconductor region as to be spaced apart from each other, said fourth transistor having said first semiconductor region as a base region, said second semiconductor region as an emitter region, and said third semiconductor region as a collector region, and said fifth resistor comprising part of said second semiconductor region; and a sixth resistor inserted between a common node of the bases of said third and fourth transistors and a gain control current source.

8. A circuit according to claim 7, further comprising a conductive layer for partially covering a surface of said third semiconductor region.

9. A variable resistance gain control integrated circuit comprising:
   first and second transistors of a first polarity type constituting a differential pair;
   a first resistor connected between the collector of said first transistor and a first power supply;
   a second resistor connected between the collector of said second transistor and the first power supply;
   a third resistor connected between the emitter of said first transistor and a second power supply;
   a fourth resistor connected between the emitter of said second transistor and the second power supply;
   a third transistor of the second polarity type, whose base region is a first semiconductor region of a first conductivity type formed on a semiconductor substrate of the second conductivity type, and whose emitter and collector regions are second and third semiconductor regions of the second conductivity type formed within said first semiconductor region and formed adjacent to each other, said emitter region being connected to the emitter of said first transistor;
   a fourth transistor of the second polarity, whose base region is said first semiconductor region and whose emitter and collector regions are fourth and fifth semiconductor regions of the second conductivity type formed within said first semiconductor region and formed adjacent to each other, said emitter region being connected to the emitter of said second transistor;
   a fifth resistor formed of a sixth semiconductor region of the second conductivity type formed on said first semiconductor region and arranged between said third and fourth transistors;
   first connecting means connecting said sixth semiconductor region and said second semiconductor region;
   second connecting means connecting said sixth semiconductor region and said fourth semiconductor region;
   third connecting means connecting said third semiconductor region and said fifth semiconductor region; and
   a sixth resistor connected between said first semiconductor region and a control current source.

10. A variable resistance gain control integrated circuit a according to claim 9, wherein said second, fourth and sixth semiconductor regions and said first and second connecting means are formed as sections of a continuous semiconductor region of said second conductivity type.

11. A variable resistance gain control integrated circuit a according to claim 10, wherein said third and fifth semiconductor regions and said third connecting means are formed as sections of a continuous semiconductor region of said second conductivity type, and a conductive layer is formed on a portion of said continuous semiconductor region.

12. A dynamic resistance element for use in a variable gain control circuit receiving an input at a differential transistor pair comprising, in combination:
   a semiconductor substrate of a first conductivity type forming a common base region;
   interconnected collector areas of a second conductivity type provided in said substrate adjacent said common base region to form a pair of electrically common collectors in said dynamic resistance element;
   emitter areas of said second conductivity type provided in said substrate adjacent said collector areas and said base region to form a pair of emitters in said dynamic resistance element, said emitters being electrically connected by a resistance element formed by an area of said second conductivity type provided in said substrate;
   conductor means for connecting said emitters to the emitter circuits of said differential pair; and
   means for providing a regulating current to said common base region to control the gain of said variable gain control circuit.

13. The circuit of claim 12 wherein said collector areas are formed by one continuous region of said second conductivity type formed in said semiconductor substrate.

14. The circuit of claim 12 wherein said emitter areas and said resistance element are formed by one continuous region of said second conductivity type formed in said semiconductor substrate.

15. The circuit of claim 13 wherein said emitter areas and said resistance element are formed by one continuous region of said second conductivity type formed in said semiconductor substrate.

* * * * *